United States Patent
Reinberg

(12) 
(10) Patent No.: US 6,258,664 B1
(45) Date of Patent: *Jul. 10, 2001

(54) METHODS OF FORMING SILICON-COMPRISING MATERIALS HAVING ROUGHENED OUTER SURFACES, AND METHODS OF FORMING CAPACITOR CONSTRUCTIONS

(75) Inventor: Alan R. Reinberg, Westport, CT (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/251,264

(22) Filed: Feb. 16, 1999

(51) Int. Cl.$^7$ .............................................. H01L 21/8242

(52) U.S. Cl. ......................... 438/255; 438/398; 438/491

(58) Field of Search .................................... 438/665, 398, 438/964, 255; 148/DIG. 138

(56) References Cited

U.S. PATENT DOCUMENTS

| | | |
|---|---|---|
| 4,891,329 | 1/1990 | Reisman et al. . |
| 5,166,084 | 11/1992 | Pfiester . |
| 5,218,213 | 6/1993 | Gaul et al. . |
| 5,240,876 | 8/1993 | Gaul et al. . |
| 5,246,886 | 9/1993 | Sakai et al. . |
| 5,658,381 * | 8/1997 | Thakur et al. . |
| 5,665,981 | 9/1997 | Banerjee et al. . |
| 5,770,500 | 6/1998 | Batra et al. . |

FOREIGN PATENT DOCUMENTS

| | | |
|---|---|---|
| 1-120069 | 5/1989 | (JP) . |
| 4-168769 | 6/1992 | (JP) . |

(List continued on next page.)

OTHER PUBLICATIONS

Yonehara, et al., "Abnormal Grain Growth In Ultra–Thin Films of Germanium on Insulator", *Mat. Res. Soc. Symp. Proc.*, vol. 25, pp. 517–524, 1984.

(List continued on next page.)

*Primary Examiner*—Charles Bowers
*Assistant Examiner*—Scott Hawranek
(74) *Attorney, Agent, or Firm*—Wells, St. John, Roberts, Gregory & Matkin, P.S.

(57) ABSTRACT

In one aspect, the invention includes a method of forming a silicon-comprising material having a roughened outer surface. A semiconductive substrate is provided which comprises conductively doped silicon. A layer comprising silicon and germanium is formed over the substrate. The layer is exposed to conditions which cause crystalline grains within it to increase in size until roughness of a surface of the layer is increased. Dopant is out-diffused from the conductively doped silicon and into the crystalline grains of the layer to conductively dope the layer. In another aspect, the invention includes a method of forming a capacitor construction. A substrate is provided and a conductively doped silicon-comprising material is formed to be supported by the substrate. A layer is formed against the conductively doped silicon-comprising material. The layer has an outermost surface, and comprises silicon and germanium. The layer is subjected to conditions which increase a roughness of the outermost surface. The layer and the conductively doped silicon-comprising material together define a first capacitor electrode. Dopant is out-diffused from the conductively doped silicon-comprising material and into the layer. A dielectric layer is formed against said outermost surface. A second capacitor electrode is formed to be separated from the first capacitor electrode by the dielectric layer.

20 Claims, 3 Drawing Sheets

FOREIGN PATENT DOCUMENTS

| | | |
|---|---|---|
| 4-271126 | 9/1992 | (JP) . |
| 4-313242 | 11/1992 | (JP) . |
| 5-094929 | 4/1993 | (JP) . |
| 5-94929 | 4/1993 | (JP) . |
| 5-129635 | 5/1993 | (JP) . |
| 5-175538 | 8/1993 | (JP) . |

OTHER PUBLICATIONS

Lee, et al., "Characteristic Comparison Between Ge–On–Insulator (GOI) and Si–On–Insulator (SOI) Beam–Induced Crystallization Mechanism," *Mat. Res. Soc. Symp. Proc.,* vol. 74, pp. 577–583, 1987.

Hinckley, et al., "Charged Carrier Transport in $Si_{1-x}Ge_x$ Pseudomorphic Alloys Matched to Si–Strain Related Transport Improvements," *Appl. Phys. Lett.,* vol. 55, pp. 2008–2010, Nov., 1989.

Kesan, et al., "High Performance 0.25 um p–MOSFETs With Silicon–Germanium Channels for 300K and 77K Operations," *IDEM Tech. Dig.,* pp. 25–58, 1991.

Nayak, et al., "Enhancement–Mode Quantum–Well $Ge_xSi_{1-x}$ PMOS," *IEEE Electron Device Letters,* vol. 12, No. 4, pp. 154–156, Apr., 1991.

Nayak, et al., "High Performance GeSi Quantum–Well PMOS On SIMOX," *IEDM Tech. Dig.,* pp. 777–780 , 1992.

Kuo, et al., "Modeling The Effect of Back Gate Bias On The Subthreshold Behavior Of A SiGe–Channel SOI PMOS Device," *Solid–State Electronics,* vol. 36, No. 12, pp. 1757–61, Great Britain, Dec. 1993.

\* cited by examiner

METHODS OF FORMING SILICON-COMPRISING MATERIALS HAVING ROUGHENED OUTER SURFACES, AND METHODS OF FORMING CAPACITOR CONSTRUCTIONS

TECHNICAL FIELD

The invention pertains to methods of forming silicon-comprising materials having roughened outer surfaces. In particular aspects, the invention pertains to methods of forming capacitor constructions.

BACKGROUND OF THE INVENTION

It is frequently desirable to form semiconductive materials having roughened outer surfaces. An exemplary semiconductive material with a roughened outer surface is hemispherical grain (HSG) polycrystalline silicon. Such material is utilized in constructions wherein it is desirable to have an extensive surface area. An exemplary construction is a capacitor electrode. Specifically, one way of increasing the total charge that can be stored by a capacitor without increasing the wafer real estate consumed by the capacitor is to increase the surface area of the capacitor's electrodes.

A difficulty in forming hemispherical grain polysilicon is in controlling a rate and amount of growth of the hemispherical grains. Problems associated with poor control of grain growth are (1) too little grain growth produces less than a desired available surface area; (2) too large of grains formed within a container capacitor can overfill the container; and (3) too much grain growth on outer surfaces of adjacent capacitors can lead to shorting between the capacitors. In light of such difficulties, it would be advantageous to develop new methods of forming semiconductive materials having roughened outer surfaces. Particularly, it would be advantageous to develop new methods of forming polycrystalline silicon materials having roughened outer surfaces.

SUMMARY OF THE INVENTION

In one aspect, the invention includes a method of forming a silicon-comprising material having a roughened outer surface. A semiconductive substrate is provided. The substrate comprises conductively doped silicon. A layer is formed over the substrate. The layer comprises crystalline grains which include silicon and germanium, and has a surface exposed to a surrounding atmosphere. The layer is exposed to conditions which cause the crystalline grains to increase in size until roughness of the surface of the layer is increased. The layer with increased surface roughness and the substrate together define a silicon-comprising material having a roughened outer surface. Dopant is out-diffused from the conductively doped silicon and into the crystalline grains of the layer to conductively dope the layer.

In another aspect, the invention includes a method of forming a capacitor construction. A substrate is provided and a conductively doped silicon-comprising material is formed to be supported by the substrate. A layer is formed against the conductively doped silicon-comprising material. The layer has an outermost surface, and comprises silicon and germanium. The layer is subjected to conditions which increase a roughness of the outermost surface. The layer and the conductively doped silicon-comprising material together define a first capacitor electrode. Dopant is out-diffused from the conductively doped silicon-comprising material and into the layer. A dielectric layer is formed against said outermost surface. A second capacitor electrode is formed to be separated from the first capacitor electrode by the dielectric layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
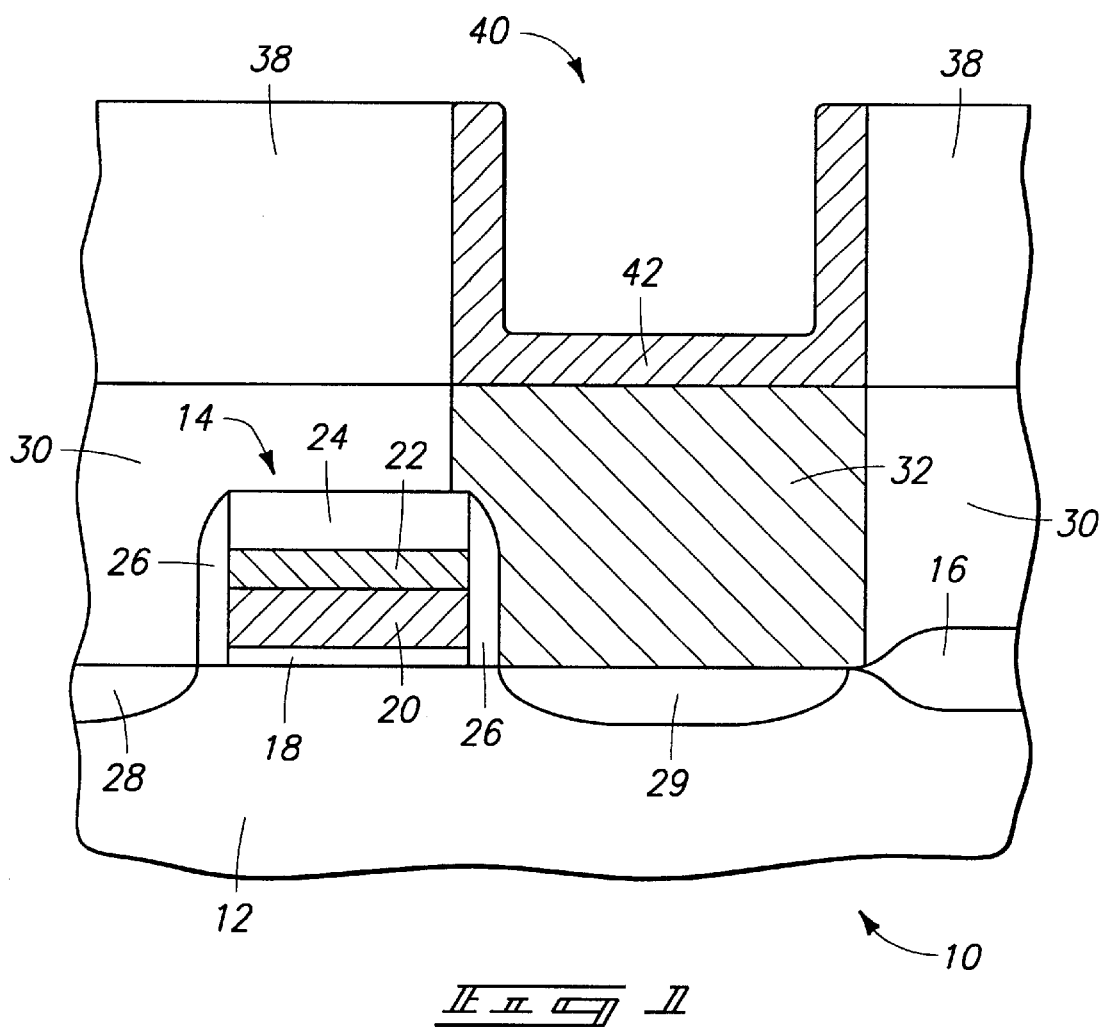
FIG. 1 is a diagrammatic, cross-sectional, fragmentary view of a semiconductive wafer fragment at a preliminary processing step of a method of the present invention.

A method of the present invention is described with reference to FIGS. 1–3. Referring first to FIG. 1, a semiconductive wafer fragment 10 is illustrated at a preliminary processing step of a method of the present invention. Wafer fragment 10 comprises a substrate 12 having a word line 14 and field oxide region 16 formed thereover. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Field oxide 16 can comprise, for example, silicon dioxide. Word line 14 comprises a conventional construction including gate oxide 18, polysilicon 20, silicide 22 and an insulative cap 24. Insulative spacers 26 are formed adjacent word line 14. Word line 14 is configured as a transistor gate, and accordingly has source/drain diffusion regions 28 and 29 provided proximate thereto.

A first insulative material 30 is provided over word line 14 and substrate 12. Insulative material 30 can comprise, for example, borophosphosilicate glass (BPSG). An opening extends through insulative material 30 to source/drain region 29, and such opening is filled with a conductive material 32. Such conductive material forms a conductive plug in electrical connection with the source/drain region 29. Conductive material 32 can comprise, for example, conductively doped polysilicon, and/or a metal, such as, for example, tungsten.

A second insulative material 38 is formed over first insulative material 30. Second insulative material 38 can comprise an identical composition as first insulative material 30 and can comprise, for example, BPSG. An opening 40 is formed within second insulative material 38 and partially filled with a semiconductive material 42. Semiconductive material 42 can comprise, for example, conductively doped silicon. In an exemplary embodiment, semiconductive material 42 comprises conductively doped polysilicon.

The construction shown for semiconductive wafer fragment 10 of FIG. 1 can be formed by conventional methods.

Figure 2:
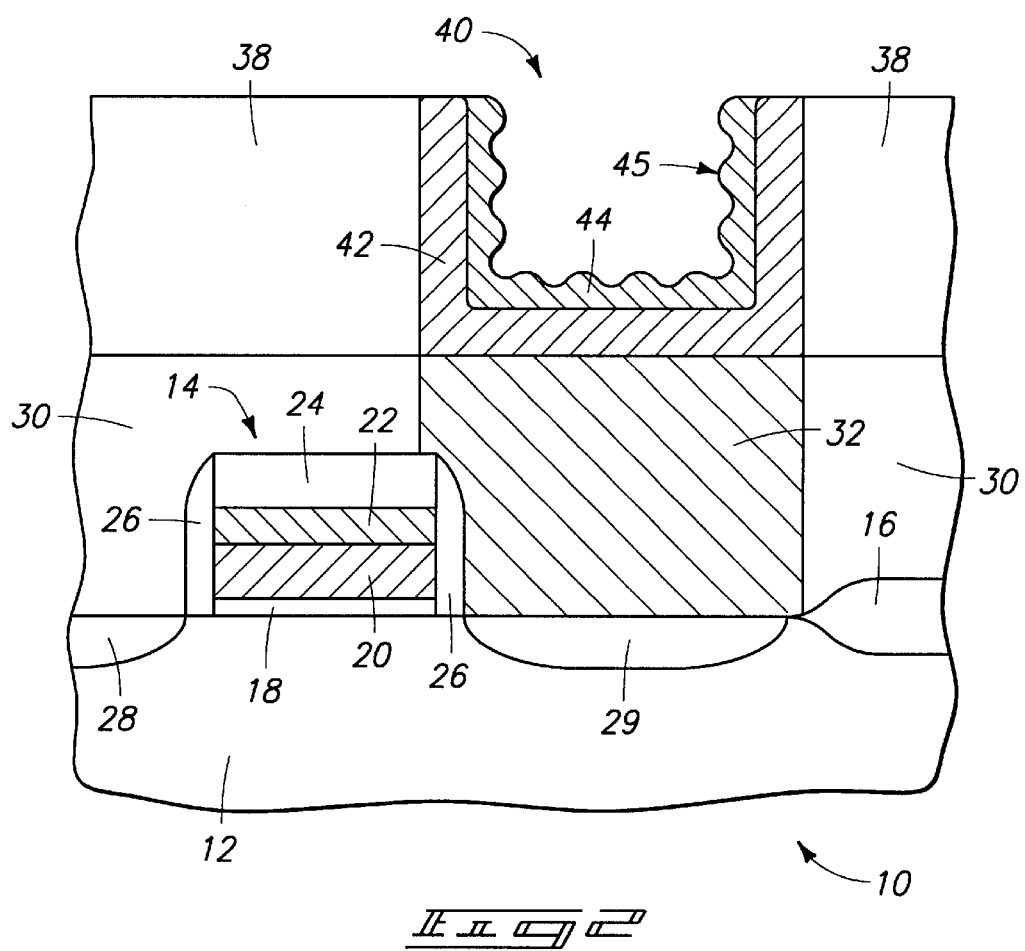
FIG. 2 is a view of the FIG. 1 wafer fragment shown at a processing step subsequent to that of FIG. 1.

Referring to FIG. 2, a layer 44 is formed within opening 40 and over semiconductive material 42. Layer 44 comprises a roughened outer surface 45. Layer 44 comprises silicon and germanium, and preferably comprises a silicon/ germanium alloy. Layer 44 is formed by utilizing germanium atoms to precipitate stress-enhanced grain growth of individual polycrystalline grains within a silicon/germanium material. Specifically, germanium atoms are larger in size relative to silicon atoms, and accordingly can induce stress into an initially formed silicon-germanium layer. Such stress causes grain growth, which can cause roughening of a surface of the silicon-germanium layer. The invention encompasses at least two particular methods of forming silicon-germanium layer 44.

In the first method, chemical vapor deposition is utilized. Such preferably comprises low pressure chemical vapor deposition. The chemical vapor deposition further utilizes reactive feed gases comprising silane ($SiH_4$) and germane ($GeH_4$). Example conditions for the chemical vapor deposition include a pressure of about 250 mTorr and a temperature of no greater than 650° C. An amount of germanium atoms provided in the deposited polycrystalline silicon/germanium film can be varied by varying a ratio of the feed gas germane relative to silane. Preferably, the resulting crystalline grains comprise a higher atomic percent of silicon than germanium in applications in which the crystalline grains are to be substituted for HSG polysilicon. In exemplary applications, the crystalline grains comprise from about 20 to about 45 atomic percent germanium, and in more preferred aspects, the crystalline grains comprise from about 20 to about 30 atomic percent germanium.

An alternative method of providing a polycrystalline alloy of silicon-germanium is to first form a polycrystalline silicon material by, for example, chemical vapor deposition utilizing silane. Subsequently, germanium atoms are implanted into the polycrystalline silicon material. An example implant dose is about $2 \times 10^{16}$ ions/cm$^2$, with a preferred energy being in the range of from about 40 keV to about 50 keV.

After the polycrystalline silicon-germanium alloy of layer 44 is formed, roughened outer surface 45 is generated by heating the alloy to an effective temperature for an effective period of time to cause individual crystal grains within the alloy to increase their size from what they were prior to the heating step. An example effective temperature is from about 600° C. to about 1,000° C. Within such temperature range, the effective period of time is from about 30 seconds to about 24 hours. Of course, the higher the temperature, the lower is the required effective time. A rate of grain growth can be increased by utilization of larger germanium ions.

The silicon/germanium polycrystalline material of layer 44 is initially deposited in an undoped form. Deposition of layer 44 in an undoped form can be advantageous over methods wherein layer 44 would be in situ doped. Specifically, in situ doping generally requires that a dopant gas be provided during a deposition process, and that an amount of the dopant gas be calibrated to obtain a desired effective doping concentration. In methods wherein layer 44 is deposited to be initially undoped, difficulties associated with provision of a dopant gas can be eliminated. In preferred embodiments of the present invention, semiconductive material 42 comprises a conductively doped material, and layer 44 is doped by out-diffusion from the conductively doped material 42. Such out-diffusion can occur during the thermal processing utilized for enlarging grains of silicon/germanium layer 44 to form roughened surface 45. Accordingly, in preferred aspects of the present invention, grain growth and doping occur simultaneously in a common thermal processing step.

Figure 3:
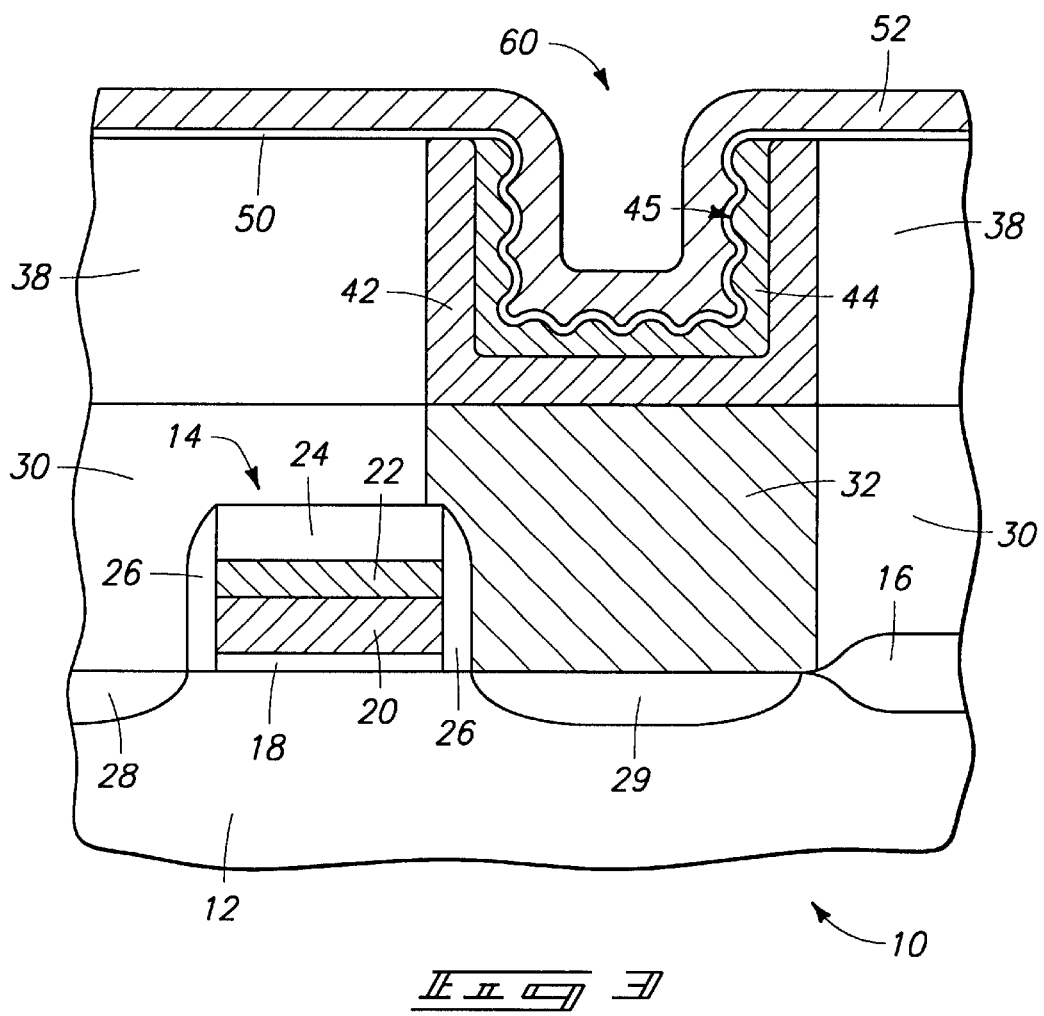
FIG. 3 is a view of the FIG. 1 wafer fragment shown at a processing step subsequent to that of FIG. 2.

Referring to FIG. 3, a capacitor construction 60 is formed. Specifically, a dielectric material 50 is formed over roughened outer surface 45 of silicon/germanium layer 44, and a conductive material 52 is formed over dielectric layer 50. In the shown construction, materials 42 and 44 together comprise a first electrode of the capacitor construction, and material 52 comprises a second electrode of the capacitor construction. Dielectric layer 50 separates the first and second electrodes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a silicon-comprising material having a roughened outer surface, comprising:

providing a semiconductive substrate comprising conductively doped silicon;

forming a non-conductively-doped layer over the substrate, the layer comprising crystalline grains which include silicon and germanium, the layer having a surface exposed to a surrounding atmosphere;

subjecting the layer to conditions which cause the crystalline grains to increase in size until roughness of the surface of the layer is increased, the layer with increased surface roughness and the substrate together defining a silicon-comprising material having a roughened outer surface; and out-diffusing dopant from the conductively doped silicon and into the crystalline grains of the non-conductively-doped layer to convert the layer to a conductively-doped layer.

2. The method of claim 1 wherein the out-diffusing occurs while the layer is subjected to conditions which cause the crystalline grains to increase in size.

3. The method of claim 1 wherein the conditions which cause the crystalline grains to increase in size comprise heating the layer and the underlying substrate, and wherein the out-diffusing occurs while the layer is subjected to the conditions which cause the crystalline grains to increase in size.

4. The method of claim 1 wherein the crystalline grains comprise a higher atomic percent of silicon than germanium.

5. The method of claim 4 wherein the crystalline grains comprise from 20 to 45 atomic percent germanium.

6. The method of claim 4 wherein the crystalline grains comprise from 20 to 30 atomic percent germanium.

7. A method of forming a silicon-comprising material having a roughened outer surface, comprising:

providing a semiconductive substrate comprising conductively doped polysilicon;

forming a layer over the substrate, the layer comprising crystalline grains of a polysilicon/germanium alloy, the layer having a surface exposed to a surrounding atmosphere;

subjecting the layer to conditions which cause the crystalline grains to increase in size until roughness of the surface of the layer is increased, the layer with increased surface roughness and the substrate together defining a silicon-comprising material having a roughened outer surface; and out-diffusing dopant from the conductively doped polysilicon and into the crystalline grains of the layer to conductively dope the layer.

8. The method of claim 7 wherein the layer comprises a non-conductively-doped polycrystalline alloy of silicon and germanium prior to the out-diffusing.

9. The method of claim 7 wherein forming the layer comprises chemical vapor deposition utilizing both a silicon precursor gas and a germanium precursor gas.

10. The method of claim 9 wherein the silicon precursor gas is silane and the germanium precursor gas is germane.

11. The method of claim 7 wherein the forming the layer comprises ion implantation of germanium into a previously formed polycrystalline silicon material.

12. The method of claim 7 wherein the out-diffusing occurs while the layer is subjected to conditions which cause the crystalline grains to increase in size.

13. A method of forming a capacitor construction, comprising:

providing a substrate;

forming a conductively doped silicon-comprising material supported by the substrate;

forming a non-conductively-doped layer against the conductively doped silicon-comprising material and having an outermost surface, the non-conductively-doped layer comprising silicon and germanium;

subjecting the non-conductively-doped layer to conditions which increase a roughness of the outermost surface, the layer and the material together defining a first capacitor electrode;

out-diffusing dopant from the conductively doped silicon-comprising material and into the non-conductively-doped layer to convert the non-conductively-doped layer to a conductively doped layer;

forming a dielectric layer against the outermost surface; and forming a second capacitor electrode separated from the first capacitor electrode by the dielectric layer.

14. The method of claim 13 wherein the out-diffusing occurs while the layer is subjected to conditions which cause the crystalline grains to increase in size.

15. The method of claim 13 wherein the forming the dielectric layer occurs after the increasing a roughness of the outer surface of the layer.

16. The method of claim 13 wherein the silicon-comprising material comprises polysilicon.

17. The method of claim 13 wherein the layer comprises a polycrystalline alloy of silicon and germanium.

18. The method of claim 13 wherein the layer comprises a polycrystalline alloy of silicon and germanium, and wherein the forming the layer comprises chemical vapor deposition utilizing both a silicon-precursor gas and a germanium precursor gas.

19. The method of claim 18 wherein the silicon-precursor gas is silane and the germanium precursor gas is germane.

20. The method of claim 13 wherein the layer comprises a polycrystalline alloy of silicon and germanium, and wherein the forming the layer comprises ion implantation of germanium into a previously formed polycrystalline silicon material.

\* \* \* \* \*